United States Patent
Li et al.

(10) Patent No.: US 11,380,842 B2
(45) Date of Patent: Jul. 5, 2022

(54) PHASE CHANGE MEMORY CELL WITH SECOND CONDUCTIVE LAYER

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Ruilong Xie, Niskayuna, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 16/515,094

(22) Filed: Jul. 18, 2019

(65) Prior Publication Data

US 2021/0020833 A1 Jan. 21, 2021

(51) Int. Cl.
*H01L 45/00* (2006.01)
*H01L 27/24* (2006.01)

(52) U.S. Cl.
CPC ............ *H01L 45/06* (2013.01); *H01L 27/24* (2013.01); *H01L 45/126* (2013.01); *H01L 45/1253* (2013.01); *H01L 45/1273* (2013.01); *H01L 45/14* (2013.01); *H01L 45/1608* (2013.01); *H01L 45/1683* (2013.01)

(58) Field of Classification Search
CPC ... H01L 45/06; H01L 45/126; H01L 45/1273; H01L 45/1683; H01L 45/1253; H01L 27/24; H01L 45/14; H01L 45/1608
See application file for complete search history.

(56) References Cited

U.S. PATENT DOCUMENTS

| | | | |
|---|---|---|---|
| 7,851,887 B2 | 12/2010 | Son | |
| 7,859,036 B2 | 12/2010 | Liu | |
| 8,049,202 B2 | 11/2011 | Khang | |
| 9,312,481 B2 | 4/2016 | Boniardi | |
| 9,748,474 B2 | 8/2017 | Liu | |
| 2006/0006472 A1 | 1/2006 | Jiang | |
| 2008/0099753 A1* | 5/2008 | Song ............... | H01L 45/1675 257/2 |

(Continued)

FOREIGN PATENT DOCUMENTS

EP    1667244 A2    6/2006

OTHER PUBLICATIONS

Xiong et al., "Inducing chalcogenide phase change with ultra-narrow carbon nanotube heaters", Applied Physics Letters 95, 243103 (2009), © 2009 American Institute of Physics, 5 pages.

*Primary Examiner* — Shahed Ahmed
*Assistant Examiner* — Sun Mi Kim King
(74) *Attorney, Agent, or Firm* — Anthony M. Pallone (57) ABSTRACT

A method may include forming a via opening in a dielectric layer, depositing a first conductive layer along a bottom and a sidewall of the via opening, depositing a second conductive layer on top of the first conductive layer. The method may further include recessing the first conductive layer to form a trench and exposing a sidewall of the second conductive layer, depositing a non-conductive material in the trench, and depositing a phase change material layer on top of the dielectric layer. The top surface of the second conductive layer may be in direct contact with a bottom surface of the phase change material layer.

8 Claims, 9 Drawing Sheets

(56) References Cited

U.S. PATENT DOCUMENTS

| | | | |
|---|---|---|---|
| 2010/0123542 A1* | 5/2010 | Vaithyanathan | H01L 45/1233 338/20 |
| 2018/0123037 A1 | 5/2018 | Redaelli | |
| 2019/0207109 A1* | 7/2019 | Ando | H01L 45/1253 |
| 2020/0136039 A1* | 4/2020 | Tsai | H01L 45/1253 |

* cited by examiner

PHASE CHANGE MEMORY CELL WITH SECOND CONDUCTIVE LAYER

BACKGROUND

The present invention relates generally to a phase change memory cell, and more particularly, to a method and structure for forming a phase change memory cell with a second conducive layer.

A phase change memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

To facilitate a change from the crystalline phase to the amorphous phase, an electrical energy, such as a voltage pulse, may be applied to one of the electrodes, for example a bottom electrode, causing the phase change material at the electrode, or substantially in the vicinity thereof, to heat above its melting temperature. The phase change material is then rapidly cooled below its glass temperature. The phase change material that is treated in this way is transformed from the crystalline phase to the amorphous phase. An amorphized area is created in the phase change material where such a phase transition has occurred.

The size of the amorphized area corresponds to the molten area created by the melting of the phase change material, and is dependent on the magnitude of the applied voltage. Where the phase change memory cell is designed to have a relatively high resistive area, a larger voltage drop and a higher temperature will occur compared to other areas of the phase change memory cell, resulting in the creation of a so-called hotspot in the phase change material at such an area.

SUMMARY

According to one embodiment of the present invention, a method is provided. The method may include forming a via opening in a dielectric layer, depositing a first conductive layer along a bottom and a sidewall of the via opening, depositing a second conductive layer on top of the first conductive layer, recessing the first conductive layer to form a trench and exposing a sidewall of the second conductive layer, depositing a non-conductive material in the trench, and depositing a phase change material layer on top of the dielectric layer. The top surface of the second conductive layer is in direct contact with a bottom surface of the phase change material layer.

According to another embodiment of the present invention, a method is provided. The method may include forming a first conductive material, forming a second conductive material, wherein an upper portion of the second conductive material is surrounded by a non-conductive material and a lower portion of the second conductive material is surrounded by the first conductive material, forming the non-conductive material, the non-conductive material is above the first conductive material, and forming a phase change material layer, wherein a top of the second conductive material is in direct contact with the phase change material layer.

According to another embodiment of the present invention, a structure is provided. The structure may include a first conductive material, a second conductive material, wherein an upper portion of the second conductive material is surrounded by a non-conductive material and a lower portion of the second conductive material is surrounded by the first conductive material, the non-conductive material, the non-conductive material is above the first conductive material, and a phase change material layer, wherein a top of the second conductive material is in direct contact with the phase change material layer.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to a phase change memory cell, and more particularly, to a method and structure for forming a phase change memory cell with a second conductive layer. Typically, the phase change memory cell includes a phase change material layer that may be in direct contact with the top surface of the second conductive layer.

Figure 1:
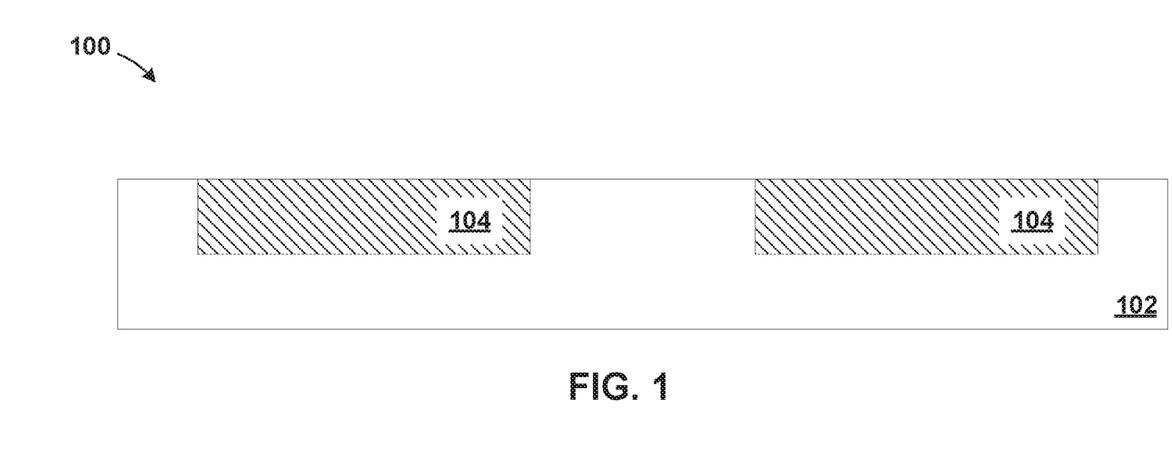
FIG. 1 is a cross section view illustrating forming of a bottom electrode in a substrate according to an exemplary embodiment.

Referring now to FIG. 1, a structure 100 is shown, in accordance with an embodiment. The structure 100 may include a substrate 102 and bottom electrodes 104. The bottom electrodes 104 may also be referred to as first electrodes. Although two bottom electrodes 104 are shown, it should be appreciated that embodiments of the present invention may include any number of bottom electrodes 104. The bottom electrodes 104 may be formed of a conductive material, such as, for example, copper, tungsten, cobalt, or aluminum, to allow for current to pass through the bottom electrodes 104. The bottom electrodes 104 may be parallel metal lines and serve as word lines or bit lines. The substrate 102 may be a silicon substrate with connections and structures, such as, for example, transistors and isolations built on it.

Figure 2:
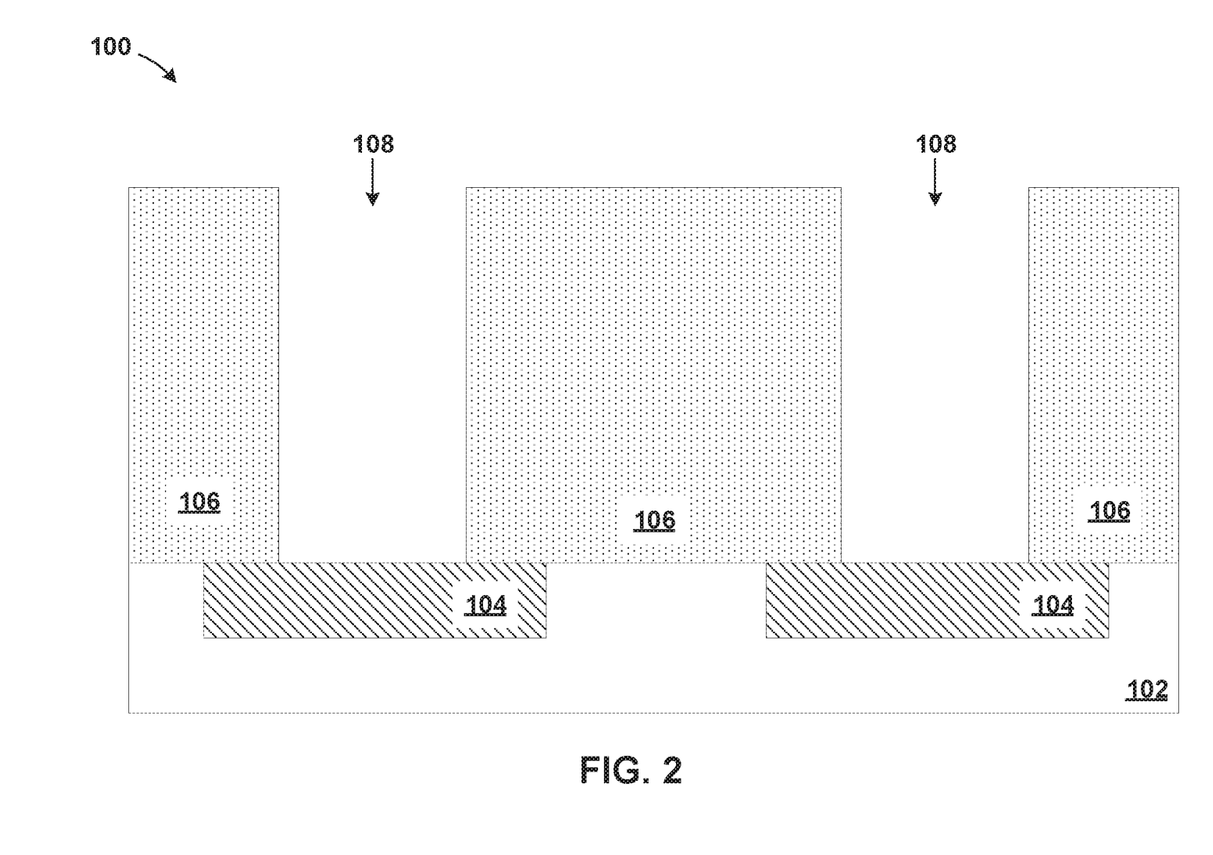
FIG. 2 is a cross section view illustrating depositing of a dielectric layer according to an exemplary embodiment.

Referring now to FIG. 2, a dielectric layer 106 may be deposited on top of the bottom electrodes 104 and the substrate 102. The dielectric layer 106 may be made of any suitable dielectric material, such as, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the dielectric layer 106.

Once the dielectric layer 106 is deposited, the dielectric layer 106 may be patterned, using known techniques to create via openings 108. The via openings 108 are patterned in the dielectric layer 106 to a size that allows for the via openings 108 to be subsequently filled with a series of layers, as described below with reference to FIG. 3. In an embodiment, the via openings 108 may be patterned to a smallest lithography size. Although two via openings 108 are illustrated in FIG. 2, it should be appreciated that embodiments of the present invention may include any number of via openings 108. In an embodiment of the invention, the number of via openings 108 may correspond to the number of bottom electrodes 104. For example, if there are four bottom electrodes 104, there may be four via openings 108 patterned in the dielectric layer 106. Alternatively, multiple via openings 108 may be patterned above a single bottom electrode 104.

The via openings 108 are patterned in the dielectric layer 10 thereby exposing top surfaces of the bottom electrodes 104. As a result, the via openings 108 may extend from the top of the dielectric layer 106 to the bottom of the dielectric layer 106. However, both the bottom electrodes 104 and the substrate 102 are intact and are not affected by the dielectric layer patterning. The structure 100, as illustrated in FIG. 2, may include the substrate 102, the bottom electrodes 104 and the dielectric layer 106 patterned to form via openings 108.

Figure 3:
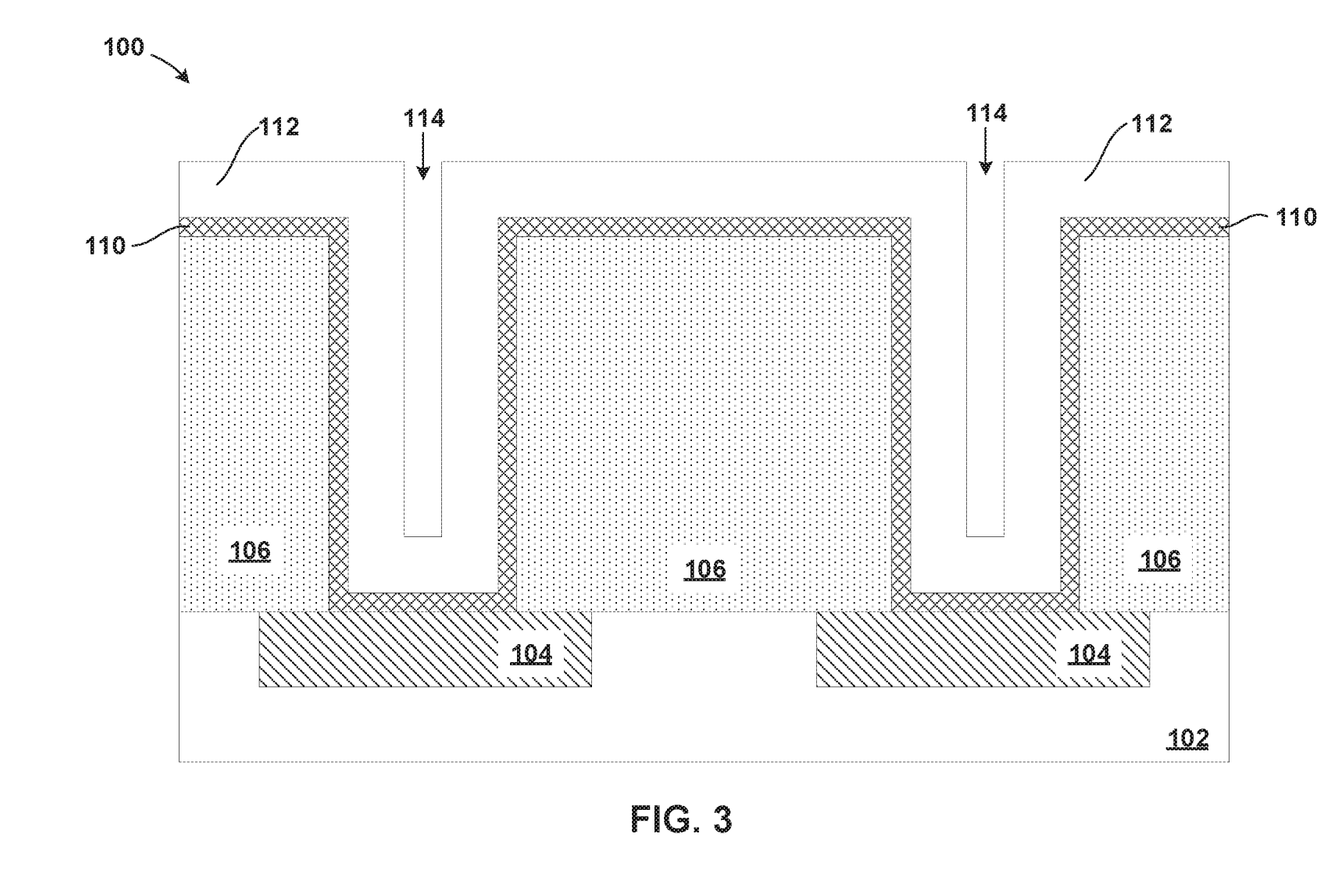
FIG. 3 is a cross section view illustrating forming of a nanotip opening according to an exemplary embodiment.

Referring now to FIG. 3, once the via openings 108 are patterned in the dielectric layer 106, a barrier layer 110 may be conformally deposited along the sidewalls and bottom of the via openings 108 using known techniques, such as, for example, an atomic layer deposition process. The barrier layer 110 may be formed by any suitable barrier material known in the art, for example titanium or a titanium-based liner material such as titanium nitride, tantalum nitride, cobalt, or ruthenium either alone or in combination with any other suitable barrier material. The barrier layer 110 acts as a barrier, preventing any conductive layer that is deposited into the via opening 108 from migrating to the dielectric layer 106. The barrier layer 110 may be conformally deposited along the sidewalls and bottom of the via openings 108 to a thickness that prevents any conductive layer from migrating to the dielectric layer 106. For example, the barrier layer 110 may be deposited along the sidewalls and bottom of the via openings 108 to a thickness of about 1 nm to 2 nm.

Once the barrier layer 110 is deposited, the atomic layer deposition process may also be used to conformally deposit a first conductive layer 112 deposited on top of the barrier layer 110 along the sidewalls and bottom of the via openings 108. The first conductive layer 112 may be made of any suitable conductive material, such as, for example, tungsten, ruthenium, titanium nitride, or titanium aluminum carbide. The first conductive layer 112 is deposited directly onto the barrier layer 110. However, the via openings 108 are not completely filled with the first conductive layer 112. Rather, the first conductive layer 112 is deposited onto the barrier layer 110 to a thickness that creates openings 114 which may subsequently be filled with a second conductive layer. The first conductive layer 112 connects to the bottom electrode 104. As a result, a current conducting path allows for the current to flows from the bottom electrode 104 into the second conductive layer 116, the phase change material layer 122, and the top electrode 124.

The conformal deposition process allows for the first conductive layer 112 to be uniformly deposited along the sidewalls and bottom of the via openings 108 until the first conductive layer 112 reaches a certain thickness. The thickness of the first conductive layer 112 may dictate the width of the openings 114. The first conductive layer 112 may be thick enough to create openings 114 that are wide enough so that the openings 114 may be uniformly filled with a second conductive material without creating voids caused by pinch offs in the second conductive material during the fill process.

For example, the via openings 108 may be patterned so that their widths are around 20 nm. The barrier layer 110 that is deposited onto the sidewalls and bottom of the via openings 108 may be 1 nm to 2 nm thick. The first conductive layer 112 that is deposited on top of the barrier layer 110 may be about 5 nm thick at each sidewall and the bottom. This creates the opening 114 that is about 6 nm to 8 nm wide. Having the opening 114 within such a range prevents voids from forming within the second conductive material during the fill process.

Figure 4:
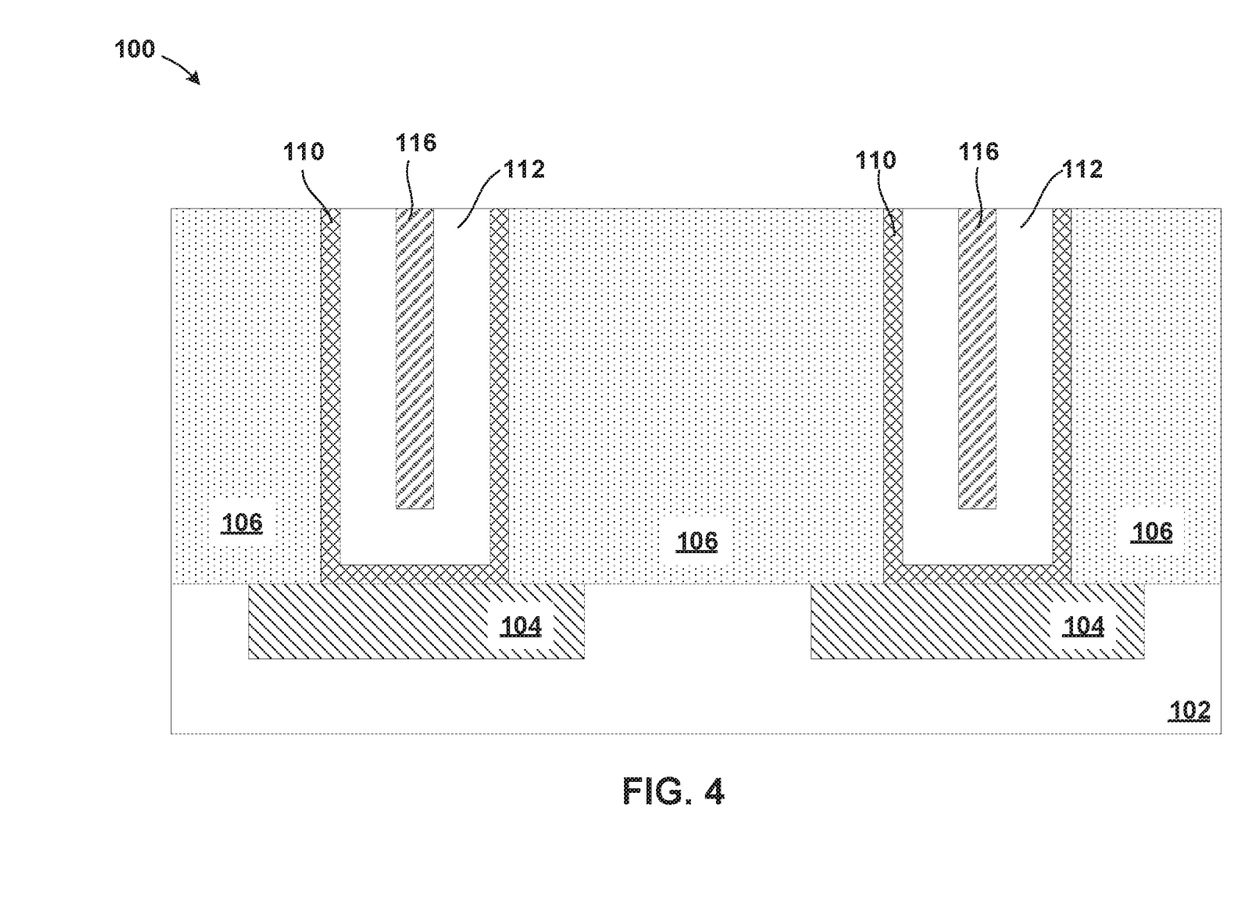
FIG. 4 is a cross section view illustrating forming of a nanotip heater according to an exemplary embodiment.

Referring now to FIG. 4, once the conductive layer 112 is deposited onto the barrier layer 110, creating the openings 114, the conformal deposition process, such as atomic layer deposition is used to fill the openings 114 with second conductive layers 116. Other conventional deposition processes, such as, for example, physical vapor deposition (PVD) process, may not be as advantageous to use during the fill process. Using the PVD process may cause pinch offs in the second conductive layers 116 when the openings 114 are filled with the second conductive layers 116.

The second conductive layer 116 is different from the first conductive layer 112. The second conductive layer 116 may be a conductive material, such as, for example tantalum or a tantalum-based liner material such as tantalum nitride, or in combination with any other suitable conductive material.

After the second conductive layers 116 are deposited into openings 114, a chemical mechanical planarization (CMP) process may be used to remove excess portions of the barrier layer 110, the first conductive layer 112, and the second conductive layer 116 remaining on top surfaces of the structure 100. The CMP process is stopped after all barrier layer 110 and first conductive layer 112 is removed from the top surface of the dielectric layer 106. The remaining structure 100, as illustrated in FIG. 4, may have the dielectric layer 106 substantially flush with upper surfaces of the barrier layer 110, the first conductive layer 112, and the second conductive layer 116.

According to an embodiment, the barrier layer 110 may be formed by any suitable barrier material known in the art, for example titanium or a titanium-based liner material such as titanium nitride and the first conductive layer 112 may be made of any suitable conductive material, such as, for example, tungsten. The second conductive layer 116 may be made of conductive material, such as, for example tantalum or a tantalum-based liner material such as tantalum nitride. As such, the barrier layer 110, the first conductive layer 112, and the second conductive layer 116 are made from different materials that have different etch rates. This allows the barrier layer 110, the first conductive layer 112, or the second conductive layer 116, either alone or in combination, to be removed or recessed without removing the other layers.

For example, a directional reactive ion etch process, an anisotropic dry etch process, or an isotropic wet etch process may be used to remove the barrier layer 110 and the first conductive layer 112 but allow the second conductive layer 116 to remain intact. In an alternative embodiment, the selective nano recess process may be used to recess the first conductive layer 112 but allow the barrier layer 110 and the second conductive layer 116 to remain intact.

Figure 5:
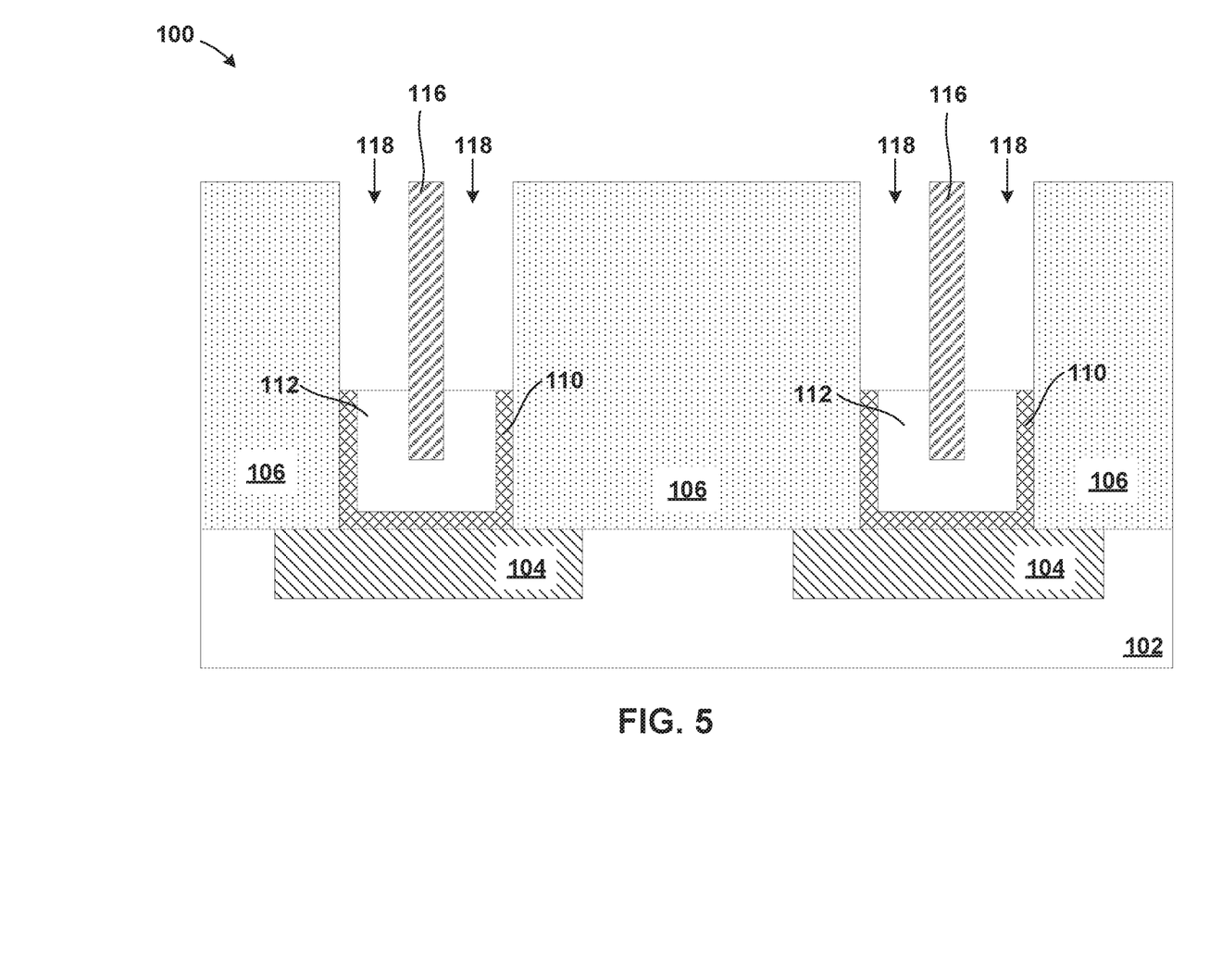
FIG. 5 is a cross section view illustrating partially removing a barrier layer and a conductive layer according to an exemplary embodiment.

Referring now to FIG. 5, the structure 100 is shown after recessing the barrier layer 110 and the first conductive layer 112 without recessing the second conductive layer 116. In an embodiment, the selective nano recess process or a directional reactive ion etch process may be used to remove a portion of the barrier layer 110 and the first conductive layer 112. The barrier layer 110 and the first conductive layer 112 are not recessed to the bottom to expose the bottom electrodes 104. Rather, some of the barrier layer 110 and the first conductive layer 112 remains. Recessing the barrier layer 110 and the first conductive layer 112 to expose the bottom electrode 104 may introduce mechanical stability issues to the structure 100. In addition, removing all of the barrier layer and the first conductive layer 112 creates a lack of electrical continuity with the second conductive layer 116.

In an embodiment, less than half of the barrier layer 110 and the first conductive layer 112 is removed, thereby exposing the sidewalls of the newly created trenches 118. Recessing the barrier layer 110 and the first conductive layer 112 also exposes the sidewalls of the second conductive layers 116. However, the second conductive layers 116 remain intact and are not recessed or removed. The trenches 118 surround the second conductive layers 116.

In an alternative embodiment, the directional reactive ion etch process, the anisotropic dry etch process, or the isotropic wet etch process may be used to recess more than half of the barrier layer 110 and the first conductive layer 112. The recessing is done to a point where some of the barrier layer 110 and the first conductive layer 112 remain and surround the bottom portion of the sidewalls of the second conductive layer 116. The contact area between the second conductive layer 116 and the first conductive layer 112 should be big enough as to not cause increased resistance in the second conductive layer 116.

For example, the via opening 108 may be about 30 nm deep. Both the barrier layer 110 and the first conductive layer 112 may be recessed to a depth between 10 nm-20 nm without causing mechanical stability issues with the second conductive layer 116. Further, because the top portion of the barrier layer 110 and the top portion of the first conductive layer 112 are not flush with the bottom surface of the second conductive layer 116, mechanical stability issues are avoided. As a result, at a minimum, only some, but not all portions of the sidewalls of the second conductive layer 116 must be exposed.

Figure 6:
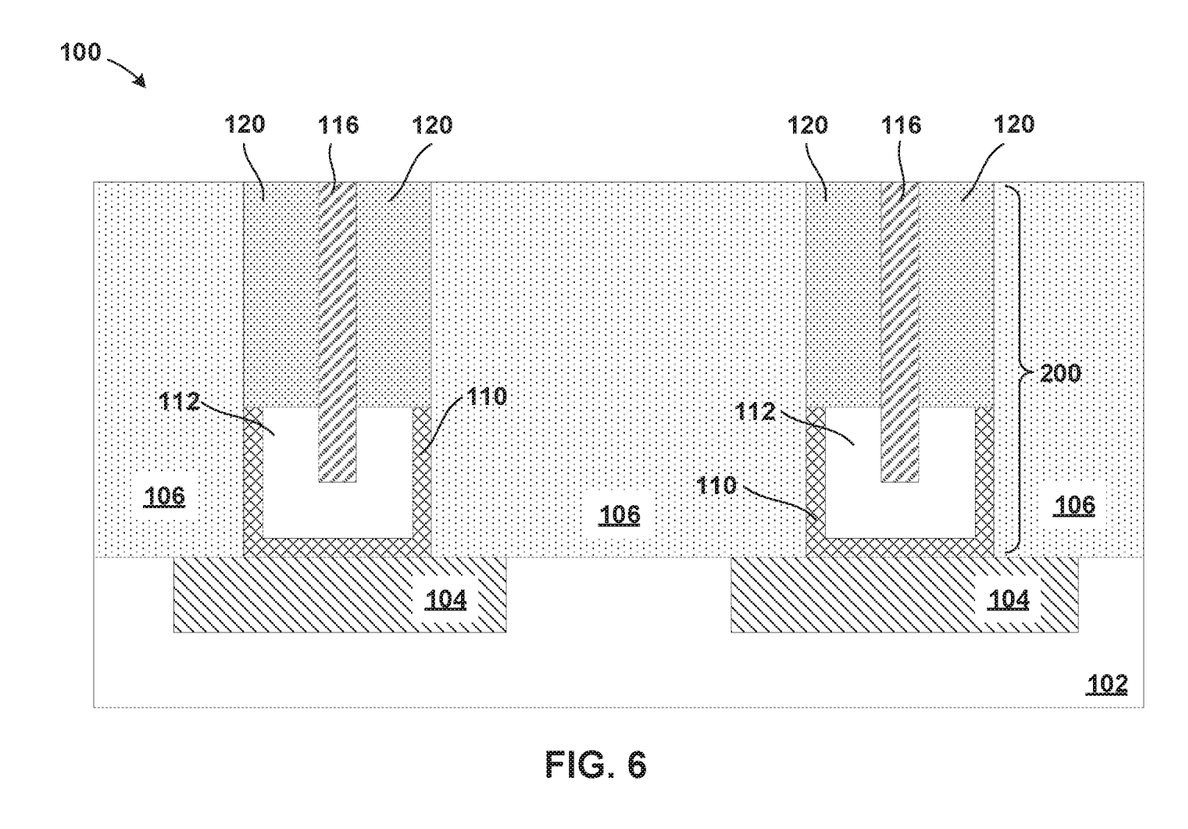
FIG. 6 is a cross section view illustrating depositing of a thermal layer according to an exemplary embodiment.

Referring now to FIG. 6, after the barrier layer 110 and the first conductive layer 112 are recessed, the trenches 118 are filled with an insulating material to form non-conductive material layers 120. In an embodiment, the trenches 118 may be filled with the same material as the dielectric layer 106. In an alternative embodiment, the trenches 118 may be filled with a different material than what is used to form the dielectric layer 106. In an embodiment, the trenches 118 may be filled with silicon nitride or any other insulating material that has low thermal conductivity.

The non-conductive material layers 120 are used, as insulators, reducing thermal loss when the structure 100 is in use. Having large non-conductive material layers 120, spanning from the top of the structure 100 to more than a half of the trench 118 is beneficial because thermal loss is substantially diminished resulting in most of the current to be contained in the second conductive layer 116. Therefore, the non-conductive material layers 120 are large enough as to diminish thermal loss and contain most of the current in the second conductive layer 116. Once the trenches 118 are filled to form non-conductive material layers 120, a CMP process may be used to remove excess insulating material remaining on the top surface of the structure 100. Collectively, the barrier layer 110, the first conductive layer 112, the second conductive layer 116, and the non-conductive material layer 120 make up a via 200.

Figure 7:
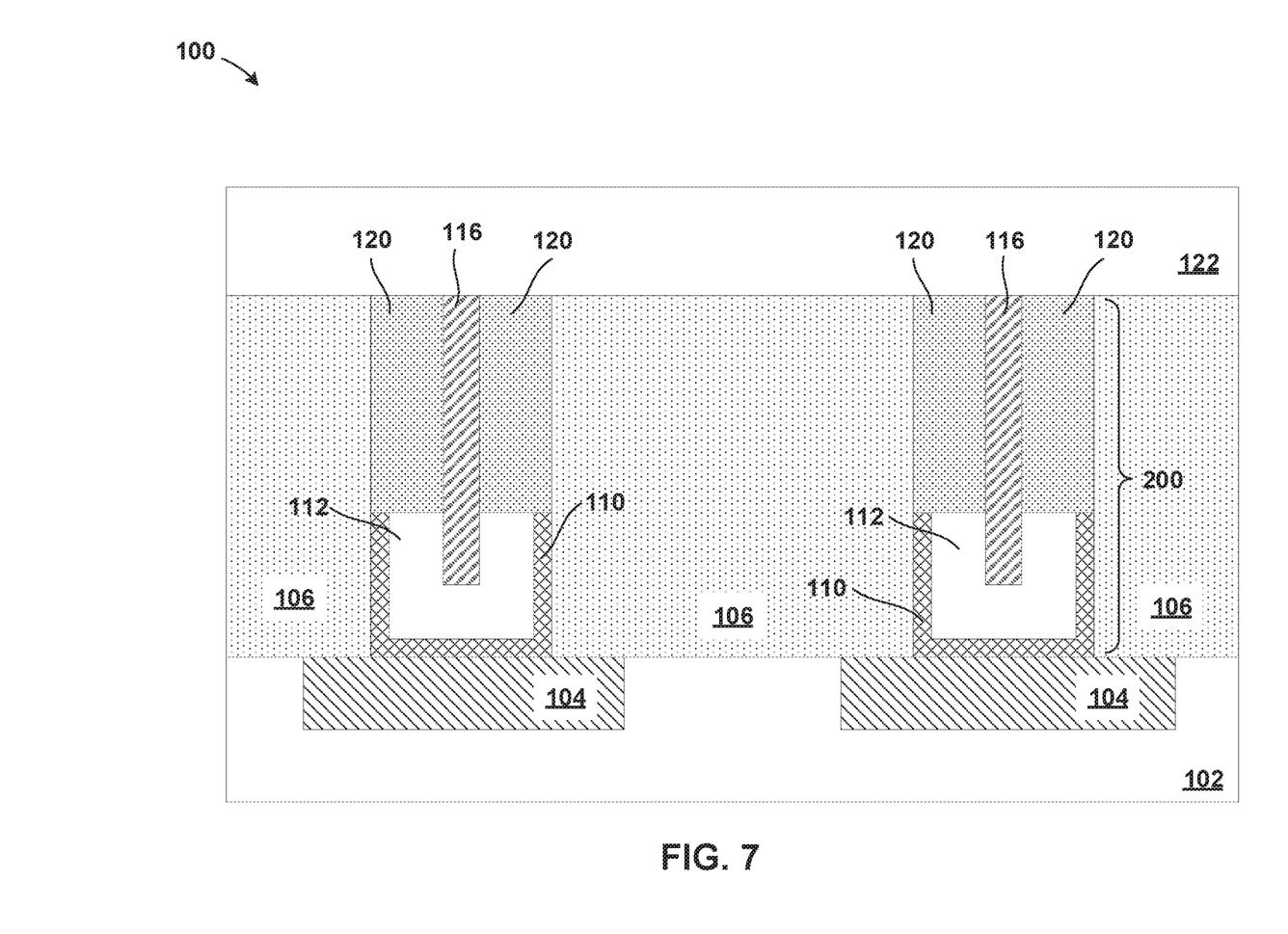
FIG. 7 is a cross section view illustrating depositing of a phase change material layer according to an exemplary embodiment.

Referring now to FIG. 7, the structure 100 is shown after a phase change material layer 122 is deposited onto the top portion of the structure 100. Conventional deposition processes, such as electroplating, electroless plating, chemical vapor deposition, physical vapor deposition, or a combination of methods, can be used to deposit the phase change material layer 122 onto the top portion of the structure 100.

The phase change material layer 122 may be formed from a mixture of Gallium (Ga) and Antimony (Sb) and at least one of Tellurium (Te), Silicon (Si), Germanium (Ge), Arsenic (As), Selenium (Se), Indium (In), Tin (Sn), Bismuth (Bi), Silver (Ag), Gold (Au), and additional Antimony (Sb). It is to be appreciated that the preceding list is merely illustrative and, thus, other elements can also be used to form the phase change material, while maintaining the spirit of the present principles. In an embodiment, the phase change material may be made of a chalcogenide alloy such as germanium-antimony-tellurium (GST).

The phase change material may also be made of a transition metal oxide having multiple resistance states. For example, the phase change material may be made of at least one material selected from the group consisting of NiO, TiO2, HfO, Nb2O5, ZnO, WO3, and CoO or GST (Ge2Sb2Te5) or PCMO (PrxCa1-xMnO3). In an embodiment, the phase change material may be a chemical compound including one or more elements selected from the group consisting of sulfur (S), selenium (Se), tellurium (Te), arsenic (As), antimony (Sb), germanium (Ge), tin (Sn), indium (In), and silver (Ag).

As described herein with reference to FIG. 6, the top surface of the second conductive layer 116 directly contacts a bottom surface of a subsequently deposited phase change material layer 122. When the current is applied to the bottom electrode 104, the second conductive layer 116 surrounded by the electrically non-conductive material layer 120 has higher current density than the rest of the current conducting path due to its smaller size. As a result, the second conductive layer 116 heats up and in turn heats the phase change material layer 122 that is in direct contact with the top surface of the second conductive layer 116. Therefore, the hottest area is the contact area between the top surface of the second conductive layer 116 and the phase change material. The non-conductive material layers 120 function as thermal barriers and reduce thermal dissipation when current is applied. This allows the heat to be concentrated to the second conductive layer 116.

The final structure 100, illustrated in FIG. 7, includes the substrate 102, the bottom electrodes 104, the dielectric layer 106, the two vias 200, and the phase change material layer 122.

Figure 8:
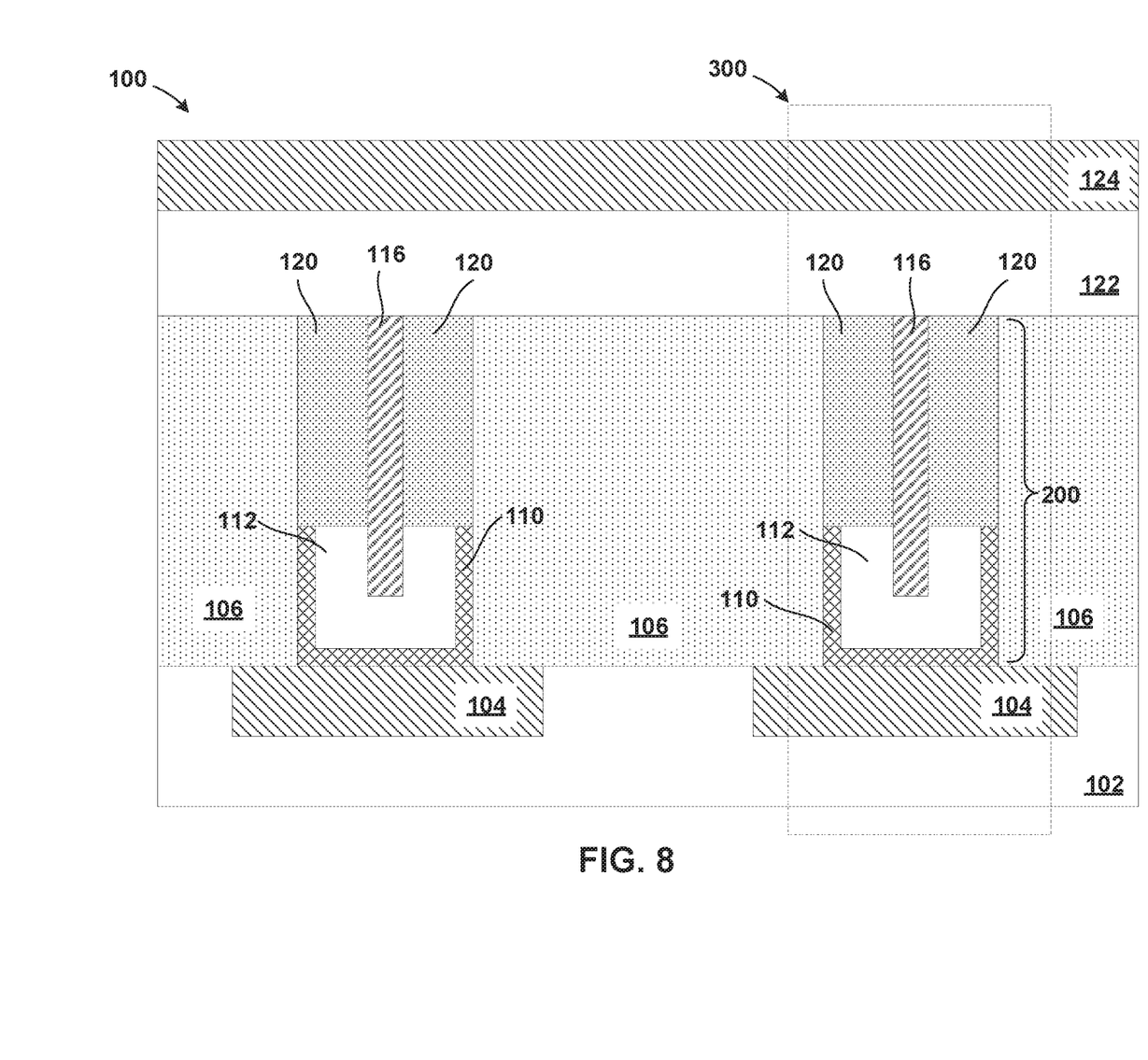
FIG. 8 is a cross section view illustrating depositing of a top electrode in direct contact with the phase change material according to an exemplary embodiment.

Referring now to FIG. 8, the structure 100 is shown after top electrodes 124 are deposited onto the top of the phase change material layer 122. The top electrodes 124 are deposited on top of the phase change material layer 122 to allow for the current to pass from the bottom electrodes 104, through the vias 200, to the phase change material layer 122. The top electrodes 124 are in direct contact with the phase change material layer 122. The top electrodes 124 are positioned orthogonally to the bottom electrodes 104. The top electrodes 124 may be made from substantially the same conductive material as the bottom electrodes 104, such as, for example, titanium nitride, copper, tungsten, or aluminum.

Once the top electrodes 124 are layered on top of the phase change material layer 122, a phase change memory (PCM) cell 300 (shown by dashed lines) is formed. The PCM cell 300 includes the substrate 102, the bottom electrode 104, the components of the via 200, the phase change material layer 122 and the top electrode 124.

In an embodiment, the current may flow between the bottom electrode 104 and the top electrode 124 allowing for the current to pass through the barrier layer 110, the first conductive layer 112, and the second conductive layer 116 to reach the phase change material layer 122. The heat generated by the current passing through the second conductive layer 116 heats the phase change material layer 122 around the top surface of the second conductive layer 116. The current required to change the phase change material layer 122 from the crystalline state to the amorphous state depends on the size of the top surface of the second conductive layer 116. That is, the smaller the top surface of the second conductive layer 116, the less current required to change the phase change material layer 122 from the crystalline state to the amorphous state. Therefore, it is advantageous to configure the second conductive layer 116 to have a minimal top surface without compromising the integrity of the second conductive layer 116.

Embodiments of the present invention described above illustrate a method and structure for forming the PCM cell 300 with the second conductive layer 116 that includes a top surface that goes beyond current lithography techniques. Embodiments of the present invention provide a solution by reducing the size of the top surface of the second conductive layer 116 thereby reducing the current needed to heat the phase change material layer 122.

The final structure 100, illustrated in FIG. 8, includes the substrate 102, the bottom electrodes 104, the components of the via 200, the phase change material layer 122 and the top electrodes 124. The via 200 includes the second conductive layer 116, the non-conductive material layers 120, and portions of the first conductive layer 112 and the barrier layer 110. The final structure 100 also includes two PCM cells 300.

Figure 9:
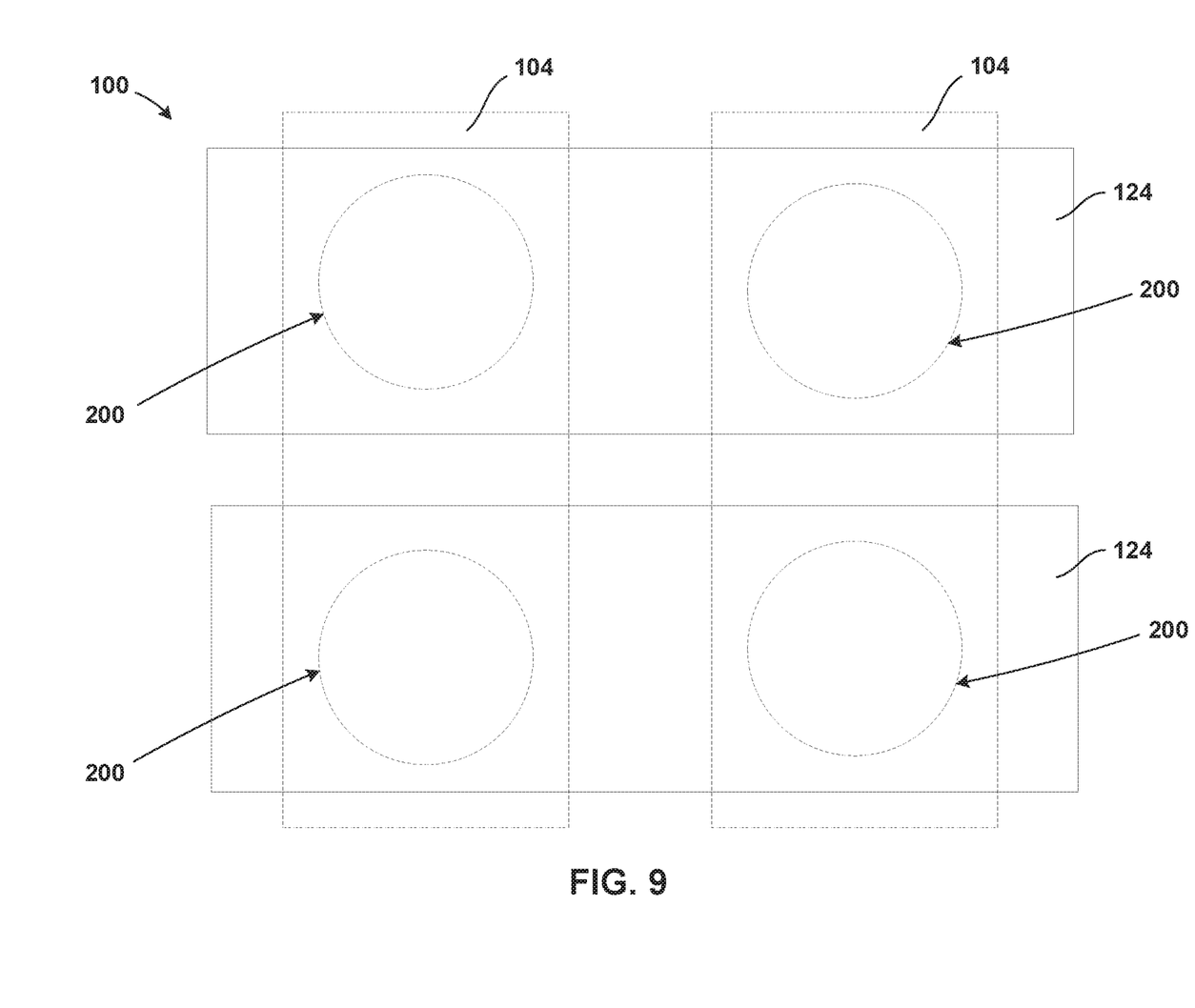
FIG. 9 is a top view of phase change memory cells illustrating positioning the top electrode orthogonally in relation to the bottom electrodes according to an exemplary embodiment.

Referring now to FIG. 9, a top view of the structure 100 is illustrated. As described herein with reference to FIG. 8, the structure 100 includes bottom electrodes 104 and top electrodes 124. FIG. 9 illustrates that the bottom electrodes 104 are orthogonal to the top electrodes 124. In addition to the bottom electrodes 104 and the top electrodes 124, the top view of the structure 100 also illustrates four vias 200.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
    a first conductive material;
    a barrier layer separating the first conductive material from a first electrode, wherein a top of the barrier layer is substantially flush with a top of the first conductive material;
    a second conductive material, wherein an upper portion of the second conductive material is surrounded by a non-conductive material and a lower portion of the second conductive material is surrounded by the first conductive material;
    the non-conductive material, the non-conductive material is above the first conductive material;

a phase change material layer, wherein a top of the second conductive material is in direct contact with the phase change material layer; and a dielectric layer below the phase change material layer, the dielectric layer is different from the non-conductive material, wherein a bottom of the phase change material layer is substantially flush with a top of the non-conductive material, a top of the dielectric layer, and a top of the second conductive material.

2. The structure of claim 1, wherein the barrier layer separates the first conductive material from a surrounding dielectric layer.

3. The structure of claim 1, further comprising:

the first electrode below and in electrical contact with the first conductive material; and a second electrode above and in electrical contact with the phase change material.

4. The structure of claim 1, wherein the first conductive material is different from the second conductive material.

5. A structure comprising:

a first conductive material;

a first electrode, the first electrode is below and in electrical contact with the first conductive material;

a barrier layer separating the first conductive material from the first electrode, wherein a top of the barrier layer is substantially flush with a top of the first conductive material;

a second conductive material, wherein an upper portion of the second conductive material is surrounded by a non-conductive material and a lower portion of the second conductive material is surrounded by the first conductive material;

the non-conductive material, the non-conductive material is above the first conductive material;

a phase change material layer, the phase change material layer is in direct contact with a top of the second conductive material;

a dielectric layer below the phase change material layer, the dielectric layer is different from the non-conductive material, wherein a bottom of the phase change material layer is substantially flush with a top of the non-conductive material, a top of the dielectric layer, and a top of the second conductive material; and a second electrode, the second electrode is orthogonal to the first electrode, the second electrode is above and in electrical contact with the phase change material.

6. The structure of claim 5, wherein the barrier layer separating the first conductive material from a surrounding dielectric layer.

7. The structure of claim 5, wherein the first conductive material is different from the second conductive material.

8. The structure of claim 7, wherein the first conductive material is made of tungsten, ruthenium, titanium nitride, or titanium aluminum carbide, and the second conductive material is made of tantalum or a tantalum-based liner material.

\* \* \* \* \*